United States Patent
Losee et al.

(10) Patent No.: US 9,899,512 B2
(45) Date of Patent: Feb. 20, 2018

(54) SILICON CARBIDE DEVICE AND METHOD OF MAKING THEREOF

(71) Applicant: General Electric Company, Schenectady, NY (US)

(72) Inventors: Peter Almern Losee, Clifton Park, NY (US); Ljubisa Dragoljub Stevanovic, Niskayuna, NY (US); Gregory Thomas Dunne, Rexford, NY (US); Alexander Viktorovich Bolotnikov, Niskayuna, NY (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 0 days.

(21) Appl. No.: 15/052,664

(22) Filed: Feb. 24, 2016

(65) Prior Publication Data
US 2017/0243970 A1  Aug. 24, 2017

(51) Int. Cl.
*H01L 29/15* (2006.01)
*H01L 29/78* (2006.01)
(Continued)

(52) U.S. Cl.
CPC ...... *H01L 29/7816* (2013.01); *H01L 29/0696* (2013.01); *H01L 29/1095* (2013.01);
(Continued)

(58) Field of Classification Search
CPC ............. H01L 29/7816; H01L 29/0696; H01L 29/1095; H01L 29/1608; H01L 29/41758;
(Continued)

(56) References Cited

U.S. PATENT DOCUMENTS 6,437,419 B1     8/2002   Bhalla et al.
6,573,534 B1 *   6/2003   Kumar ................ H01L 29/1608
                                                    257/328
(Continued)

FOREIGN PATENT DOCUMENTS

JP       08186254 A       7/1996
JP    2006066439 A        3/2006
(Continued)

OTHER PUBLICATIONS

Wang, Z., et al.; "Temperature-Dependent Short-Circuit Capability of Silicon Carbide Power MOSFETs"; Power, Electronics, IEEE Trans., pp. 1555-1566, Feb. 2016, vol. 32 Issue 2.
(Continued)

*Primary Examiner* — Allen Parker
*Assistant Examiner* — Frederick B Hargrove
(74) *Attorney, Agent, or Firm* — John P. Darling

(57) ABSTRACT

Embodiments of a silicon carbide (SiC) device are provided herein. In some embodiments, a silicon carbide (SiC) device may include a gate electrode disposed above a SiC semiconductor layer, wherein the SiC semiconductor layer comprises: a drift region having a first conductivity type; a well region disposed adjacent to the drift region, wherein the well region has a second conductivity type; and a source region having the first conductivity type disposed adjacent to the well region, wherein the source region comprises a source contact region and a pinch region, wherein the pinch region is disposed only partially below the gate electrode, wherein a sheet doping density in the pinch region is less than $2.5 \times 10^{14}$ cm$^{-2}$, and wherein the pinch region is configured to deplete at a current density greater than a nominal current density of the SiC device to increase the resistance of the source region.

20 Claims, 8 Drawing Sheets

(51) Int. Cl.
*H01L 29/10* (2006.01)
*H01L 29/06* (2006.01)
*H01L 29/417* (2006.01)
*H01L 29/16* (2006.01)
*H01L 29/66* (2006.01)

(52) U.S. Cl.
CPC .... *H01L 29/1608* (2013.01); *H01L 29/41758* (2013.01); *H01L 29/66681* (2013.01)

(58) Field of Classification Search
CPC .............. H01L 29/66681; H01L 29/816; H01L 27/0696
See application file for complete search history.

(56) References Cited

U.S. PATENT DOCUMENTS

| | | | |
|---|---|---|---|
| 7,087,973 | B2 | 8/2006 | Mallikarjunaswamy et al. |
| 2004/0195644 | A1* | 10/2004 | Mallikarjunaswamy H01L 27/0738 257/491 |
| 2008/0014693 | A1* | 1/2008 | Matocha ............. H01L 29/1608 438/238 |
| 2009/0236612 | A1 | 9/2009 | Nakamura et al. |
| 2014/0117367 | A1 | 5/2014 | Blanchard et al. |
| 2015/0108564 | A1 | 4/2015 | Miura et al. |
| 2016/0133706 | A1* | 5/2016 | Ishigaki ............. H01L 29/7805 257/77 |

FOREIGN PATENT DOCUMENTS

| | | |
|---|---|---|
| JP | 2009064970 A | 3/2009 |
| JP | 2015170818 A | 9/2015 |
| WO | WO 2014203317 A1 * 12/2014 | ......... H01L 29/7805 |

OTHER PUBLICATIONS

Sattar, A., et al.; IXYS Corporation; "Linear Power MOSFETS Basic and Applications"; IXAN0068, Accessed Feb. 2016, pp. 1-7, https://www.google.com/?gws_rd=ssl#q=Linear+Power+MOSFETS+Basic+and+Applications+Abdus+Sattar.

Huang, X., et al.; "Short-Circuit Capability of 1200V SiC MOSFET and JFET for Fault Protection", 2013, pp. 197-200. Future Renewable Electric Energy Delivery and Management Systems Center, North Carolina State University.

A PCT Search Report and Written Opinion issued in connection with corresponding PCT Application No. PCT/US2017/019138 dated May 16, 2017.

* cited by examiner

SILICON CARBIDE DEVICE AND METHOD OF MAKING THEREOF

BACKGROUND

The subject matter disclosed herein relates to semiconductors and, more specifically, to silicon carbide (SiC) devices.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Typically, silicon carbide (SiC) based devices (e.g., transistors such as metal-oxide-semiconductor field-effect transistors (MOSFETs) insulated gate bipolar transistors (IGBTs) or the like) are operated with higher gate-source drive voltage as compared to silicon (Si) based devices. In addition, such devices typically employ short channels, tight cell pitch and include heavily doped (e.g., a sheet doping density (concentration) greater than about $2.5 \times 10^{14}$ cm$^{-2}$, or in some embodiments, for example where a box profile depth is about 0.25 um, a doping concentration greater than about $1 \times 10^{19}$ cm$^{-3}$) source regions to obtain a low on-state resistance (on-resistance), $R_{ds}$(on). As a result, in these use conditions SiC based devices often exhibit up to approximately twenty times nominal current density before saturation occurs, often exhibiting a much softer "quasi" saturation of drain family I-V characteristics. However, such features may have a detrimental impact on the ability of the device to withstand short-circuit faults in certain applications, for example, such as power conversion systems. In addition, a strong negative temperature dependence of threshold voltage typically exhibited in SiC MOS based devices can result in an instantaneous increase of saturation current during fault conditions as local heat increases proximate one or more structures (e.g., MOS channels) occurs. Further, much of the evolution of device designs has been focused on reducing device on-state resistance, which further increases peak current under fault conditions. It is now recognized that there is a need for an improved SiC device and method of fabricating thereof.

BRIEF DESCRIPTION

Embodiments of a silicon carbide (SiC) device and a method for fabricating the SiC device are provided herein. In some embodiments, a silicon carbide (SiC) device may include a gate electrode disposed above a SiC semiconductor layer, wherein the SiC semiconductor layer comprises, a drift region having a first conductivity type, a well region disposed adjacent to the drift region, wherein the well region has a second conductivity type; and a source region having the first conductivity type disposed adjacent to the well region, wherein the source region comprises a source contact region and a pinch region, wherein the pinch region is disposed partially below the gate electrode, wherein a sheet doping density in the pinch region is less than $2.5 \times 10^{14}$ cm$^{-2}$, and wherein the pinch region is configured to deplete at a current density greater than a nominal current density of the SiC device to increase the resistance of the source region.

In some embodiments, a silicon carbide (SiC) device may include a plurality of semiconductor device cells, wherein each of the plurality of semiconductor device cells comprises, a drift region having a first conductivity type, a gate electrode disposed above the drift region, a well region disposed adjacent to the drift region, wherein the well region has a second conductivity type, and a source region having the first conductivity type disposed adjacent to the well region, wherein the source region comprises a source contact region and a pinch region, wherein the pinch region is not completely disposed below the gate electrode, wherein a sheet doping density in the pinch region is less than $2.5 \times 10^{14}$ cm$^{-2}$ and a sheet doping density in the source contact region is at least $2.5 \times 10^{14}$ cm$^{-2}$, and wherein the well region is doped about two times (2×) to about fifteen times (15×) greater than the pinch region.

In some embodiments, a method of fabricating a silicon carbide (SiC) semiconductor layer may include forming a source region having a first conductivity type, comprising implanting a pinch region of the source region to a sheet doping density of substantially less than $2.5 \times 10^{14}$ cm$^{-2}$ and implanting a source contact region of the source region adjacent to the pinch region to a sheet doping density higher than that of the pinch region, forming a well region having a second conductivity type adjacent to the source region by implanting the well region to a sheet doping density that is about two times (2×) to about fifteen times (15×) higher than that of the pinch region, and forming a gate electrode above a portion of the pinch region and a portion of the well region, wherein the gate electrode does not completely cover the pinch region of the source region.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

Figure 1:
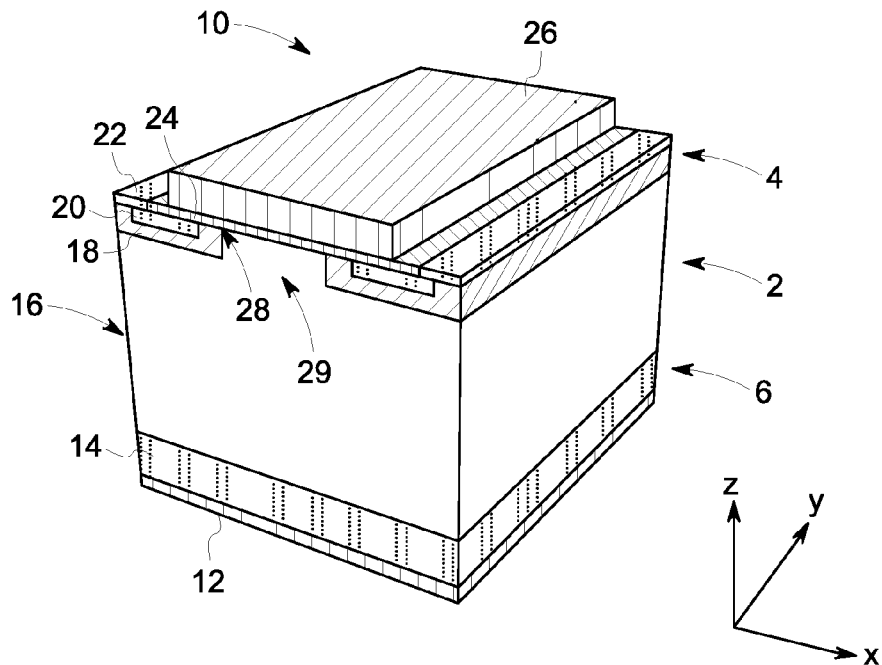
FIG. 1 is a schematic of a typical planar MOSFET device.

One or more specific embodiments of the present disclosure will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements.

Present embodiments are directed toward semiconductor device designs (e.g., silicon carbide (SiC) based devices such as SiC MOSFET designs) in which the source region includes a depleteable pinch region (e.g., having a sheet doping density less than about $2.5 \times 10^{14}$ cm$^{-2}$, or in some embodiments, between approximately $2.5 \times 10^{12}$ cm$^{-2}$ and approximately $5 \times 10^{13}$ cm$^{-2}$) that provides a nonlinear, current-density dependent resistance to improve current saturation characteristics under fault conditions. As discussed below, the disclosed pinch region generally functions to constrict or "pinch-off" high source current densities, such as between approximately 4× and approximately 10× the nominal current density ($J_{DS,nominal}$).

When power switches utilizing SiC based devices (e.g., such as SiC MOSFETs) are used to connect a load to a high-voltage terminal in a power electronic circuit, or are stacked in a half-bridge configuration across power terminals of a power electronic system, the switches may sometimes encounter fault conditions where they are part of a temporary low impedance path shorting high-voltage terminals. This can result from erroneously gating "on" multiple switches concurrently in a bridge circuit or a physical short occurring across other terminals in the power electronic circuit. It is desirable for the power switches to withstand such short-circuit fault conditions long enough for protection circuits/systems to react and prevent failure of the system. Accordingly, for present embodiments, during short-circuit fault conditions, a potential difference is created between the well region and the pinch region that substantially depletes the pinch region, thereby increasing the source series resistance and reducing the peak current during the fault.

Also, the disclosed pinch region does not significantly increase on-state resistance of a device operating at nominal current densities, and therefore, does not significantly impact normal performance of the device. Accordingly, embodiments of the present disclosure may enable improving short-circuit fault ruggedness of semiconductor devices without compromising device performance during normal (i.e., non-faulting) operation. As such, the disclosed device designs are generally more adaptable for high power applications as compared to conventional device designs.

Embodiments discussed herein relate to SiC based devices, for example, such as SiC based MOSFET devices. It should be appreciated, however, that the disclosed SiC device may be any type of field-effect transistor (FET) device. However, to simplify explanation, and to facilitate discussion in the context of a concrete example, the present discussion will be provided in the context of the MOSFET described with respect to FIG. 1.

One of the essential building blocks of modern power electronics is the field-effect transistor (FET) device. For example, FIG. 1 illustrates an active cell of a planar n-channel field-effect transistor, for example a DMOSFET, hereinafter MOSFET device 10. It may be appreciated that, in order to more clearly illustrate certain components of the MOSFET device 10, as well as other devices discussed below, certain commonly understood design elements (e.g., top metallization, passivation, edge termination, and so forth) may be omitted. The illustrated MOSFET device 10 of FIG. 1 includes a semiconductor layer 2 (e.g., a silicon carbide (SiC) semiconductor layer) having a first surface 4 and a second surface 6. The semiconductor layer 2 includes a drift region 16 having a first conductivity type (e.g., an n-type drift layer 16), a well region 18 adjacent to the drift region and proximal to the first surface, the well region 18 having a second conductivity type (e.g., a p-well 18). The semiconductor layer 2 also includes a source region 20 that is adjacent to the well region 18, the source region having the first conductivity type (e.g., n-type source region 20). A gate insulating layer 24 is disposed on a portion of the first surface 4 of the semiconductor layer 2, and a gate electrode 26 is disposed on the gate insulating layer 24. The second surface 6 of the semiconductor layer 2 is a substrate layer 14, and the drain contact 12 is disposed on the bottom of device 10 along the substrate layer 14. Source/body contact 22 is disposed on top of the semiconductor layer 2, partially covering source region 20 and well/body regions 18. During operation, an appropriate gate voltage (e.g., at or beyond a threshold voltage ($V_{TH}$) of the MOSFET device 10) may cause an inversion layer to be formed in the channel region 28, as well as a conductive path to be enhanced in the junction field-effect transistor (JFET) region 29 due to accumulation of carriers, allowing current to flow between the contact 22 (i.e., the source electrode) and the drain contact 12. It should be appreciated that, for the MOSFET devices discussed herein, the channel region 28 may be generally defined as an upper portion of the well region 18 disposed below the gate electrode 26 and gate dielectric 24.

It should be noted that, in contrast with embodiments of the present approach discussed below, the typical MOSFET device 10 illustrated in FIG. 1 includes a source region 20 that is heavily doped (e.g., a sheet doping density greater than about $2.5 \times 10^{14}$ cm$^{-2}$, or in some embodiments, for example where a box profile depth is about 0.25 um, a doping concentration greater than about $1 \times 10^{19}$ cm$^{-3}$) throughout to minimize on-state resistance of the device 10.

Figure 2:
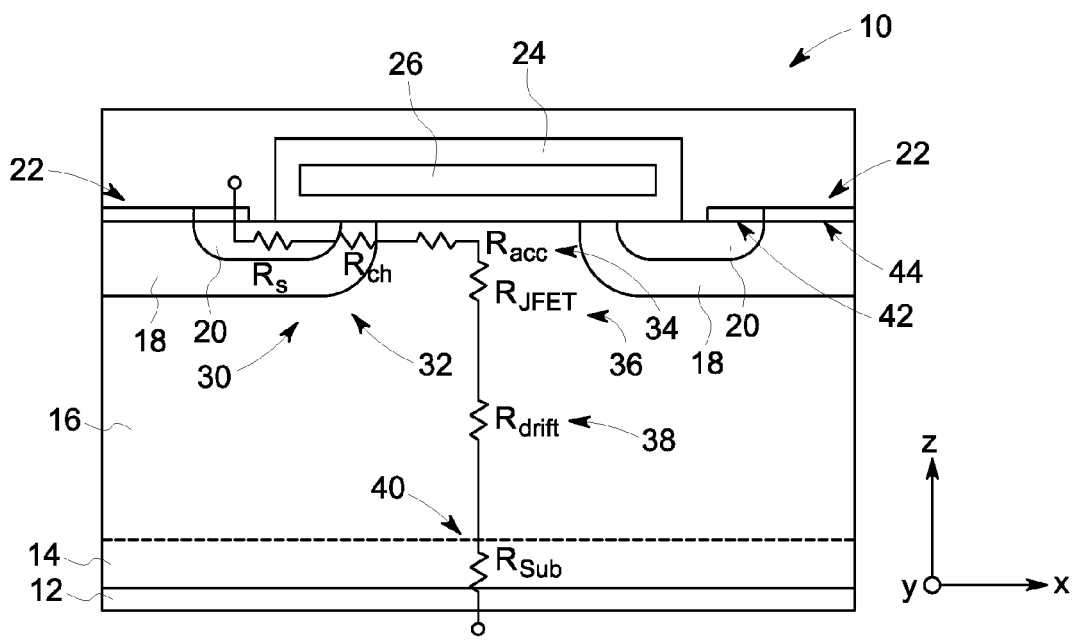
FIG. 2 is a schematic illustrating resistances for various regions of the typical MOSFET device of FIG. 1.

Resistances for various regions of the typical MOSFET device 10 of FIG. 1 are illustrated in the schematic of FIG. 2. FIG. 2 generally illustrates many of the same features illustrated in FIG. 1. Additionally, as more clearly illustrated in FIG. 2, the contacts 22 of the MOSFET device 10, which generally provide an ohmic connection to the source electrode, are disposed over both a portion of the source region 20 and a portion of the well region or body region 18. The contact 22 is generally a metallic interface comprising one or more metal layers situated between these semiconductor portions of the MOSFET device 10 and the metallic source electrode. In particular, the portion of the source region 20 of the MOSFET device 10 disposed below the contact 22 may be referred to herein as a source contact region 42 of the MOSFET device 10. Further, the portion of the well/body region 18 of the MOSFET device 10 that is disposed below the contact 22 may be referred to herein as a body contact region 44 of the MOSFET device 10.

As illustrated in FIG. 2, the various regions of the MOSFET device 10 may each have an associated resistance, and a total resistance when in an on-state (e.g., an on-state resistance or on-resistance, $R_{ds}$(on) of the MOSFET device 10. The on-state resistance or on-resistance, $R_{ds}$(on) may be represented as a sum of a plurality of resistances. For example, as illustrated in FIG. 2, on-state resistance, $R_{ds}$(on), of the n-channel MOSFET device 10 may be approximated as a sum of: a source resistance ($R_s$) 30 (e.g., a resistance of n+ region 20 and a resistance of the contact 22); a channel resistance ($R_{ch}$) 32 (e.g., a resistance of inversion channel region 28 illustrated in FIG. 1); an accumulation resistance ($R_{acc}$) 34 (e.g., a resistance of an accumulation layer between the gate oxide 24 and portion of drift layer 16 located between p-well regions 18); a JFET resistance ($R_{JFET}$) 36 (e.g., resistance of undepleted neck region between p-well regions 18); a drift layer resistance ($R_{drift}$) 38 (e.g., the resistance about the drift layer 16); and a substrate resistance ($R_{sub}$) 40 (e.g., the resistance about the substrate layer 14). Note that the resistances illustrated in FIG. 2 are not intended to be exhaustive, and that other resistances (e.g., drain contact resistance, spreading resistance, etc.) could potentially be present within the semiconductor device 10. Furthermore, while the present approach may be discussed below in the context of SiC based devices (e.g., SiC MOSFET based devices), it should be appreciated that the present approach may be applicable to other types of material systems (e.g., silicon (Si), germanium (Ge), aluminum nitride (AlN), gallium nitride (GaN), gallium arsenide (GaAs), diamond (C), or any other suitable semiconductor) as well as other types of device structures (e.g., UMOSFET, VMOSFETs, insulated gate bipolar transistors (IGBT), insulated base MOS-controlled thyristors (IBMCT), junction field effect transistors (JFET), and metal-semiconductor field effect transistor (MESFET), or any other suitable device) utilizing both n- and p-channel designs.

While some methods of reducing resistance of the channel region 28 ($R_{ch}$ 32) improves conduction losses, it may also result in higher peak current density when the device is in an on-state. Saturation current density may refer to the current at which the FET enters the saturation or "active" mode. The onset of saturation may refer to the drain current density where the differential output conductance has been reduced to one fifth of that of the linear region (e.g., defined by the inverse of the on-resistance, where most power MOSFETs will operate in the on-state). In some long-channel MOSFETs, this saturation current is independent of drain-source voltage and may be expressed in accordance with the following relationship:

$$I_{d,sat} = \frac{uC_{ox}W}{2L} \times (V_{GS} - V_T)^2 \qquad \text{(Equation 1)}$$

Where u is channel mobility, W is channel periphery, $C_{ox}$ is MOS gate-oxide-semiconductor capacitance, L is channel length, $V_{GS}$ is gate-source voltage, and $V_T$ is threshold voltage. However, when considering short-channel devices with additional series (fixed and variable) resistance (e.g., drift, JFET, etc.) components, additional drain-source voltage dependent terms can be added, such as:

$$I_{d,sat} = \frac{uC_{ox}W}{2L} \times (V_{GS} - V_T)^2 \times (1 + \text{Lambda} V_{DS}) \qquad \text{(Equation 2)}$$

Where Lambda is a fitting parameter defining an assumed constant slope of $I_{DS}$ versus $V_{DS}$ after the onset of current saturation, and $V_{DS}$ is drain-source voltage.

Further, the negative temperature dependence of the threshold voltage may cause the saturation current density to increase further as the device may locally heat under fault conditions. For example, as the temperature of the SiC MOSFET device 10 increases, the threshold voltage decreases, which may further increase the saturation current density and leads to high peak current during short-circuit fault conditions. In some instances, under the peak currents, the SiC MOSFET device 10 is able to function at temperatures, voltages, and/or currents outside desirable operating ranges. The time in which it takes the SiC MOSFET device 10 to fail under short-circuit conditions may be referred herein as the short-circuit withstand time (SCWT). It may be beneficial to design the SiC MOSFET device 10 to extend the SCWT such that a scheme may be employed to handle the short-circuit fault in some desirable way (e.g., shut the device off) before the device or system is damaged or degraded. It may be appreciated that, in addition to limiting peak currents under fault conditions, present embodiments discussed below can also enable longer SCWT (e.g., between 5 and 20 microseconds (μs)) to give such fault management mechanisms sufficient time to turn off the device before the device is damaged or degraded. In some embodiments, the SCWT may be extended when supporting greater than 30 percent of rated drain-source voltage.

Figure 3:
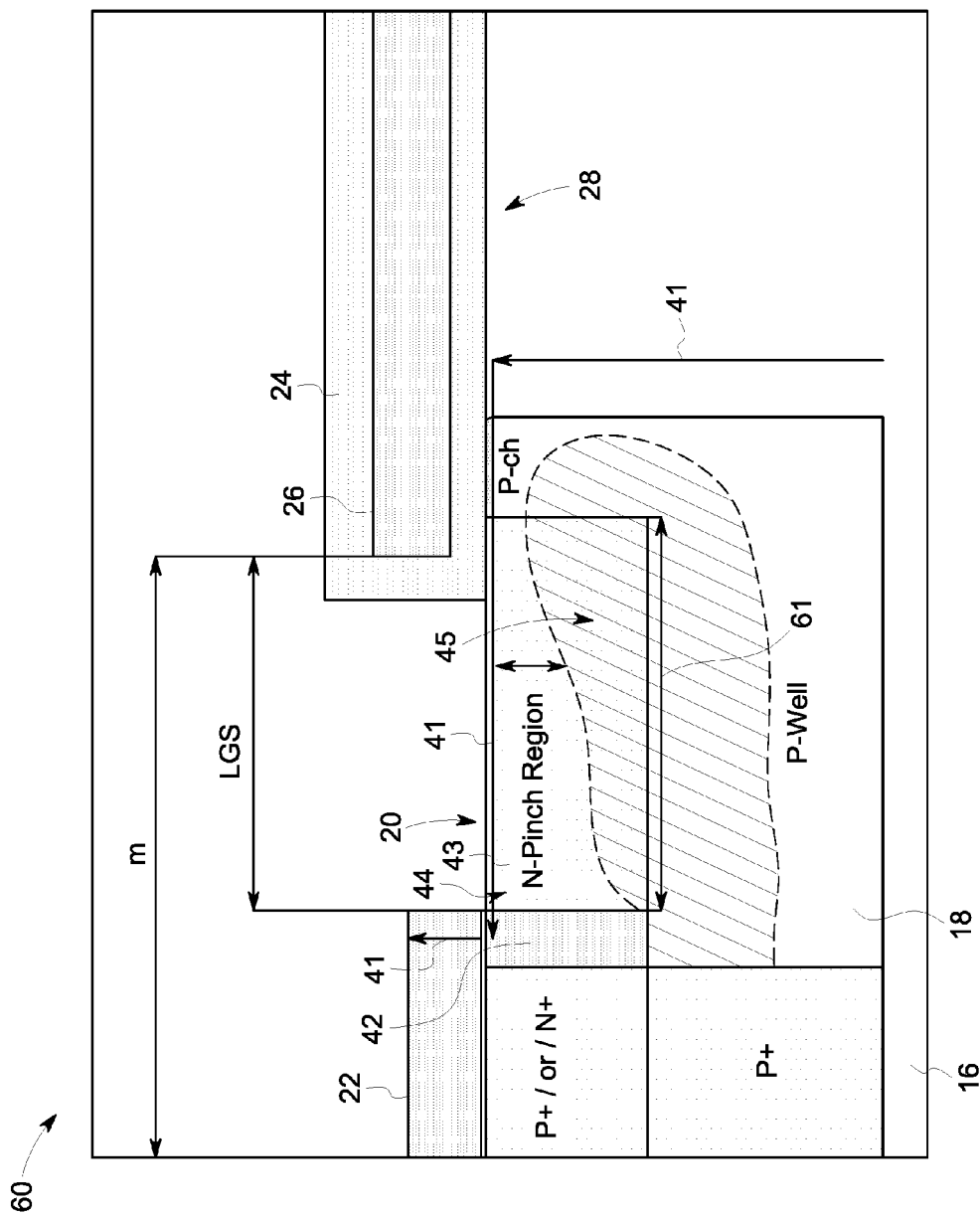
FIG. 3 is a schematic of a portion of a SiC MOSFET device including a lightly doped pinch region, in accordance with embodiments of the present technique.

An embodiment of a portion of a SiC device 60 (e.g., a SiC MOSFET device) having a source region 20 that includes a lightly doped pinch region 43 is shown in the schematic of FIG. 3. The SiC device 60 may include a number of semiconductor device cells and each of the semiconductor device cells may include at least the source region 20 including the pinch region 43 and the source contact region 42, the well region 18, and the drift region 16. As depicted, the pinch region 43 is disposed adjacent to the source contact region 42 and the well region 18. It should be understood that the light doping of the pinch region 43 enables depletion of or "pinching off" free carriers between the source region 20 and the channel region 28 under high current flow at on-state. The source contact region portion 42, which is doped significantly more than the pinch region 43, may have a sheet doping density greater than approximately $2.5 \times 10^{14}$ cm$^{-2}$, or in some embodiments between approximately $2.5 \times 10^{14}$ cm$^{-2}$ and approximately $5 \times 10^{15}$ cm$^{-2}$ or in some embodiments between approximately $1.8 \times 10^{15}$ cm$^{-2}$ or approximately $3.75 \times 10^{15}$ cm$^{-2}$). In certain embodiments, the sheet doping density in the pinch region 43 may be less than about $2.5 \times 10^{14}$ cm$^{-2}$, or in some embodiments, between approximately $2.5 \times 10^{12}$ cm$^{-2}$ and approximately $5 \times 10^{13}$ cm$^{-2}$. Additionally, it may be appreciated that the width 61 of the pinch region 43 also affects the amount of source series resistance provided by the depleted pinch region 43 under high current flow. Accordingly, the length 61 of the lightly doped pinch region 43 may be selected based on desired source series resistance. For example, in certain embodiments (e.g., SiC MOSFETs), the length 61 of the pinch region 43 may vary between approximately 0.5 micrometers (μm) and approximately 2.5 μm. In some embodiments, the sheet doping density of the pinch region 43 times the length of the pinch region 43 is from approximately $1.25 \times 10^8$ cm$^{-1}$ to $125 \times 10^8$ cm$^{-1}$.

As depicted in FIG. 3, the channel region 28 of the SiC device 60 is in an on-state (e.g., under strong inversion). Accordingly, current is flowing along the arrows 41 from the channel region 28 through the source region 20 (i.e., through the pinch region 43 and source contact region 42) to the contact 22. As the current flows, a potential difference is created between the well region 18 and the pinch region 43 in such a manner such that resistance and the current density results in a voltage drop. As the voltage drop between the well or body region and the pinch region 43 increases, a depletion region 45 between the pinch region 43 and the well region 18 begins building, predominantly in the pinch region 43. In some embodiments, the well region 18 is doped by about two times (2×) to about fifteen times (15×) greater than the pinch region 43. As the depletion region 45 expands, an area that lacks free carriers is created that "pinches off" or constricts current at a lower amount compared to other more highly doped designs. As a result, source series resistance is increased and the forward drop in voltage is increased. This feedback mechanism is enabled by the pinch region 43, in which high current causes the depletion region 45 to expand, which limits saturation current density for the device 60. At the same time, by utilizing a source region 20 that includes both a lightly doped pinch region 43 and a highly doped source contact region 42, the on-resistance of the device 60 does not significantly increase during normal operation, as described below. The difference in the sheet doping density of the well region 18 and the pinch region 43 may enable backchannel depletion in the depletion region 45 during high current via the feedback mechanism discussed above. As depicted, in some embodiments, at least a portion of the pinch region 43 may be partially disposed below the gate electrode 26. When present, such a configuration may also aid the backchannel depletion. That is, the pinch region 43 is disposed below the gate electrode 26 and not below the gate electrode 26 (e.g., the pinch region 43 is not completely under the gate electrode 26). While one configuration is shown, it is to be understood that any portion of the pinch region 43 may be disposed below the gate electrode 26 that is sufficient to provide the benefits as described herein. For example, in some embodiments, substantially most of the pinch region 43 (as determined by the length 61) may not be disposed below the gate electrode 26. In addition, in some embodiments, the gate region does not overlap the N+ source contact region 42 in active cell regions.

Providing at least a portion of the pinch region 43 beneath the gate electrode 26 may provide better performance (e.g., limits saturation current density while keeping a lower on-state resistance under normal operating conditions) as compared to configurations where a portion of the pinch region 43 does not extend from, or is completely contained under, the gate electrode 26.

One or more dimensions may be varied to adjust characteristics of the SiC device 60. For example, in some embodiments, an "overhead" dimension of the cell, or cell width not covered by gate (collectively referred to as "m") and/or a gate to source spacing (LGS) may be reduced to reduce channel 28 resistance or overall on resistance. In such embodiments, the m and/or LGS dimensions may be "process technology" limited distances, that is, based on, or limited by, processing technology such as minimum feature size, layer to layer alignment tolerances, or the like.

In some embodiments, the LGS dimension may be used to provide the pinch region 43 that increases series resistance under higher than nominal current. The increase in series resistance enabled by the pinch region 43 having a length that extends from under the gate electrode 26 may enable a reduced cell pitch (e.g., <6.5 um) in comparison to a length that does not extend from under the gate electrode 26 as it uses length to add source pinch resistance. Thus, using a length of such a region that does not extend from under the gate electrode 26 (or is contained under the gate electrode) increases the gate-source overlap area for a given pinch resistance, which increases a gate to source capacitance $C_{gs}$ and slows the switching speed of the device. As such, the presently disclosed embodiments that use the pinch region 43 having a length that extends from under the gate electrode 26 may enable a reduced cell pitch (lower channel resistance) and $C_{gs}$ and increased switching speed of the SiC device 60 for a given pinch resistance, as compared to using a length that does not extend from under the gate electrode 26.

As may be appreciated, typical SiC based devices may include certain features that provide undesirable short-circuit performance. For example, in some SiC based devices, the inversion channel mobility may be low, which may lead to reducing cell pitch, to increase periphery, and to shorten the channel region 28 in order to improve on-resistance. It may be appreciated that cell pitch refers to the minimum repeat dimension from any point on the cross-sectional view of the MOSFET device 10 illustrated in FIG. 2. However, reducing cell pitch may lead to high saturation current densities. Further, combining the above features with small chip sizes may lead to undesirable short-circuit performance of the devices. However, using the techniques disclosed herein, the SiC device 60 with the lightly doped pinch region 43 may enable reduced cell pitch and low on-resistance across nominal operating temperatures, while significantly improving short-circuit performance.

Figure 4:
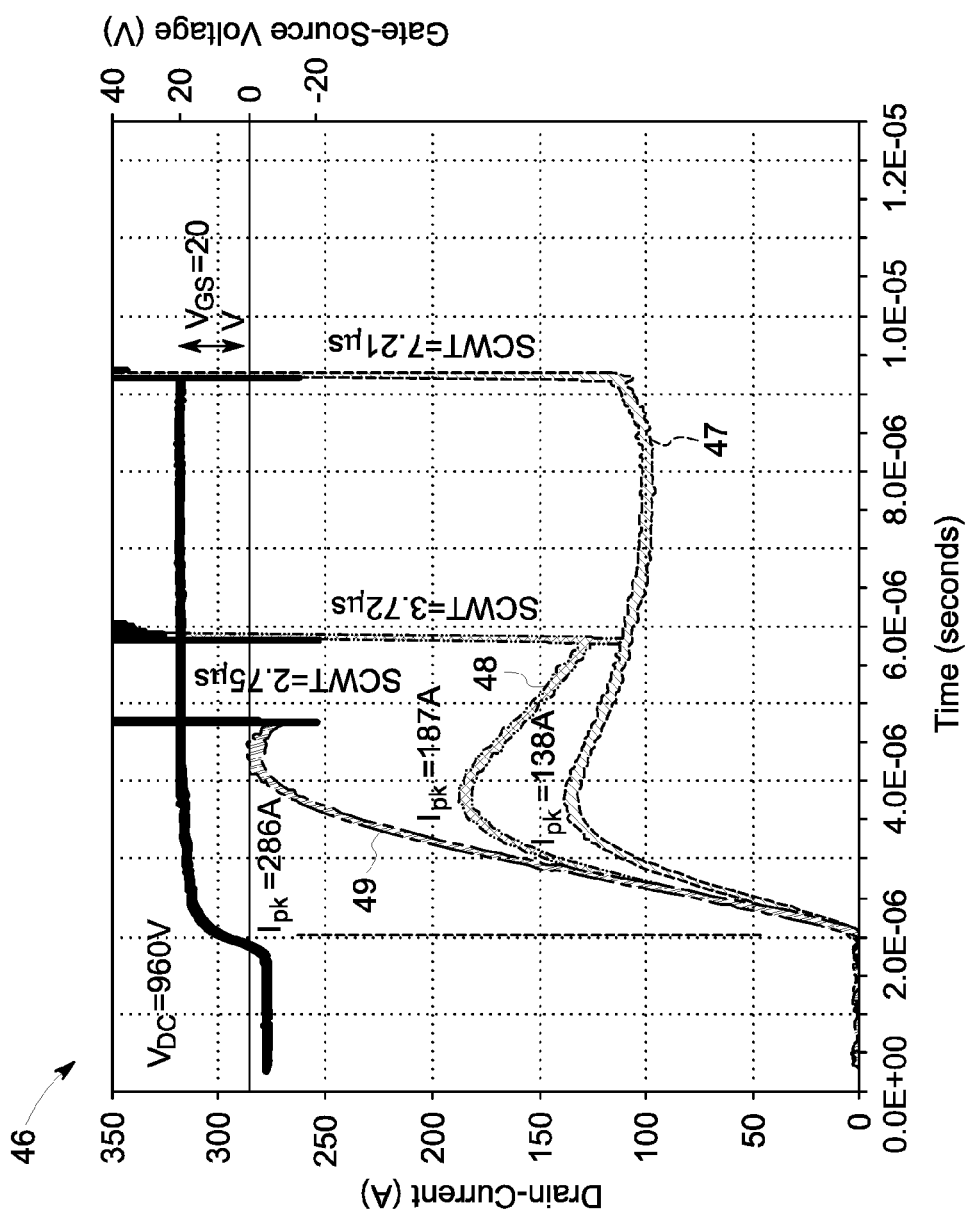
FIG. 4 is a graph showing the voltage and current waveforms illustrating short-circuit withstand time (SCWT) of 1.2 kilovolt (kV) rated SiC MOSFET devices under high current, wherein the cell pitches and doping vary between designs, in accordance with embodiments of the present techniques.

To illustrate, FIG. 4 is a graph 46 showing short-circuit withstand time (SCWT) of 1.2 kilovolt (kV) SiC MOSFET devices under high current short-circuit conditions for different designs. Curve 47 represents a SiC device 60 of the present approach having a lightly doped pinch region 43 (e.g., sheet doping density of approximately $9 \times 10^{12}$ cm$^{-2}$) and a small cell pitch (e.g., approximately 4.5 μm to 5 μm). Curve 49 represents a SiC MOSFET having a heavily doped source region 20 (e.g., sheet doping density of greater than about $2.5 \times 10^{14}$ cm$^{-2}$) and a larger cell pitch (e.g., approximately 6 μm to 6.5 μm, approximately 1.27 times larger than the cell pitch of the design represented by curve 47). Curve 48 represents a SiC MOSFET having a heavily doped source region 20 and a larger cell pitch (e.g., approximately 9 µm to 9.5 µm, approximately 1.92 times larger than the cell pitch of the design represented by curve 47). As shown in the figure, the presently disclosed SiC device (SiC device 60 described above), represented by the curve 47, demonstrates an improved short-circuit performance (e.g., a SCWT of approximately 7.21 µs), compared to the SCWTs provided by other designs (e.g., 3.72 µs and 2.75 µs). Further, the design represented by curve 47 demonstrates the lowest peak current and lowest current over most of the duration of the fault as compared to the other designs represented by curves 48 and 49.

Figures 5, 6:
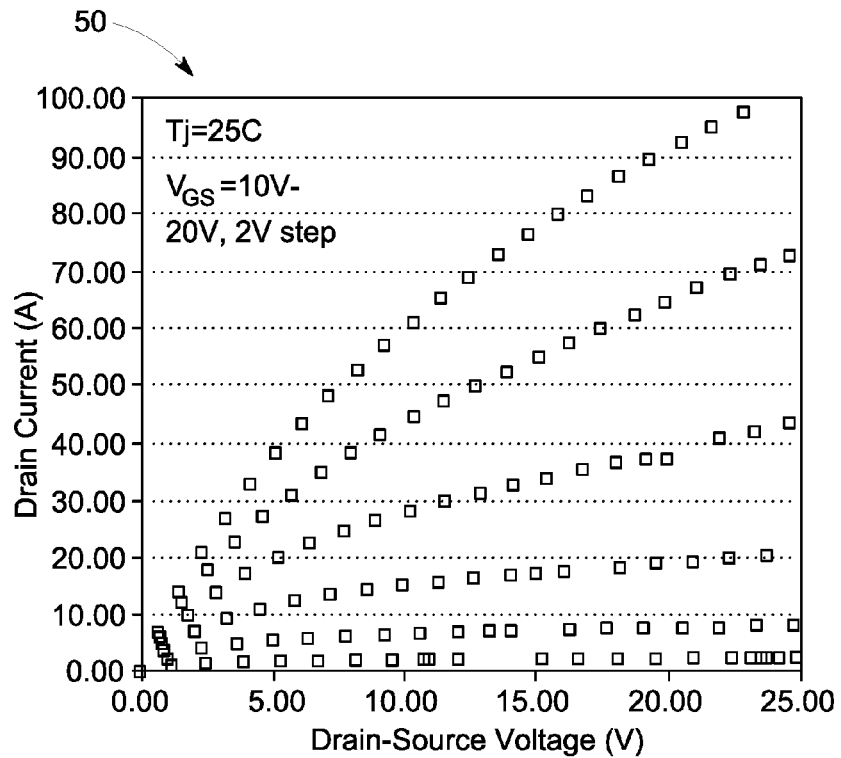
FIG. 5 is a graph illustrating output current-voltage characteristics of a 1.2 kV rated SiC MOSFET device at 25° C. for various gate-source voltages, wherein the pinch region is lightly doped and the cell pitch is reduced, in accordance with embodiments of the present techniques.
FIG. 6 is a graph illustrating output current-voltage characteristics of a 1.2 kV rated SiC MOSFET device at 25° C. for various gate-source voltages, wherein the source region is heavily doped but the cell pitch is increased, in accordance with embodiments of the present techniques.

FIG. 5 is a current-voltage (IV) plot 50 for the embodiment of the SiC MOSFET 60 represented by the curve 47 in FIG. 4 operating at different gate biases (i.e., 10V, 12V, 14V, 16V, 18V, and 20V) at 25° C. For comparison, FIG. 6 is an IV plot 52 for the SiC MOSFET device represented by the curve 48 in FIG. 4 at different gate biases (i.e., 10V, 12V, 14V, 16V, 18V, and 20V) at 25° C. As indicated by the similar slopes of the curves in the graphs 50 and 52, the on-resistance is substantially the same between the two designs under nominal current ratings of approximately 20-30 A. Therefore, in addition to providing superior short-circuit performance, as indicated by FIG. 4, the lightly doped pinch region 43 of the presently disclosed designs does not significantly increase the on-resistance of the device.

Figure 7:
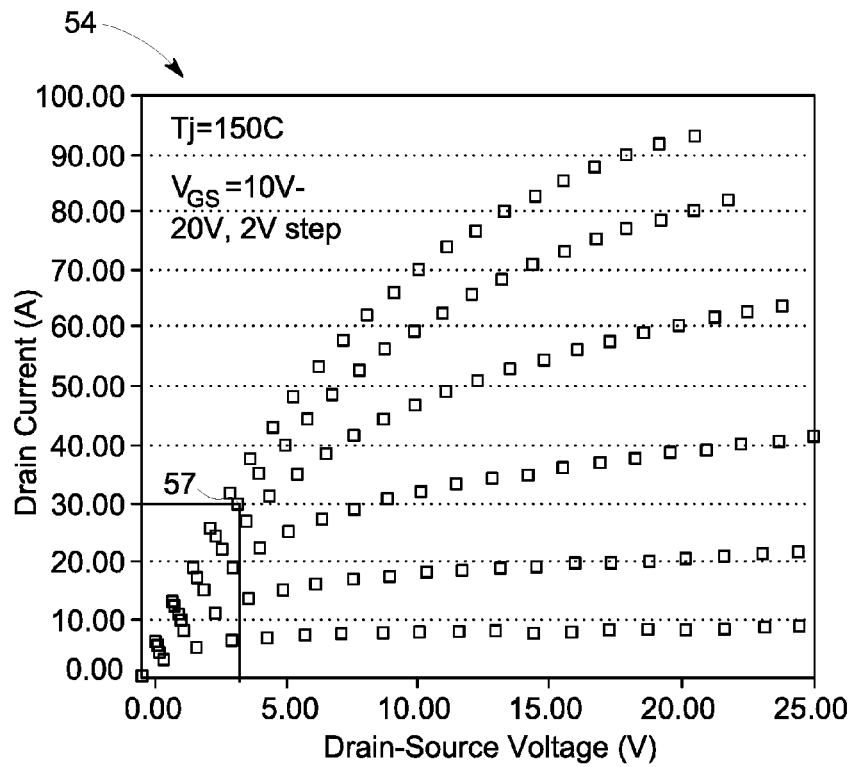
FIG. 7 is a graph illustrating output current-voltage characteristics of a 1.2 kV rated SiC MOSFET device at 150° C. for various gate source voltages, wherein the pinch region is lightly doped and the cell pitch is reduced, in accordance with embodiments of the present techniques.
Figure 8:
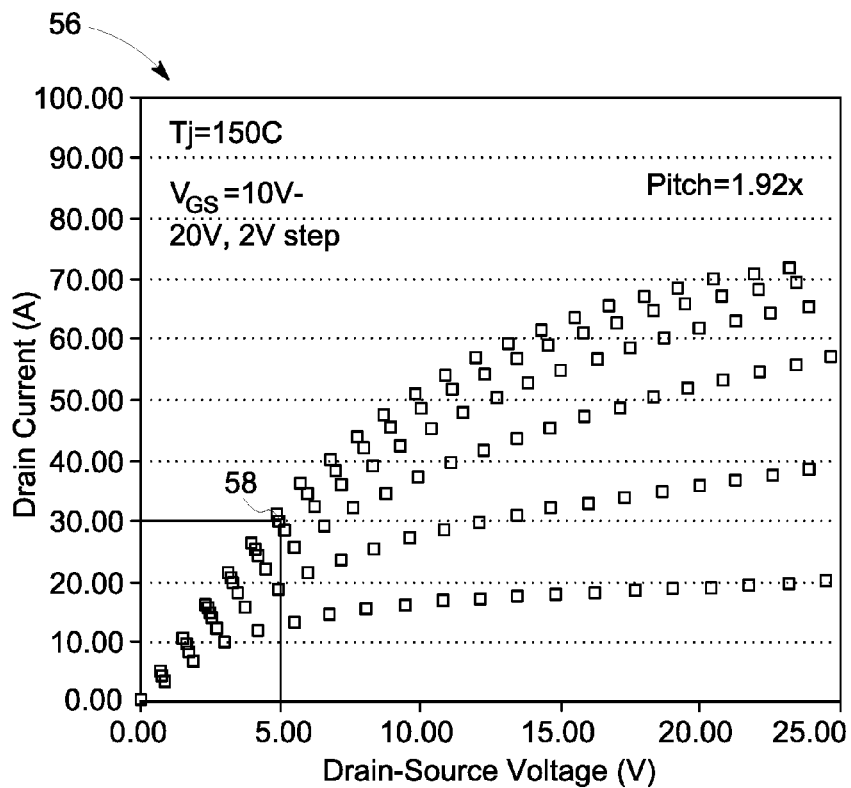
FIG. 8 is a graph illustrating output current and voltage characteristics of a 1.2 kV SiC MOSFET device at 150° C. for various gate source voltages, wherein the source region is heavily doped and the cell pitch is increased, in accordance with embodiments of the present techniques.

FIG. 7 is a current-voltage (IV) plot 54 for the embodiment of the SiC MOSFET 60 represented by the curve 47 in FIG. 4 operating at different gate biases (i.e., 10V, 12V, 14V, 16V, 18V, and 20V) at 150° C. For comparison, FIG. 8 is an IV plot 56 for the SiC MOSFET device represented by the curve 48 in FIG. 4 at different gate biases (i.e., 10V, 12V, 14V, 16V, 18V, and 20V) at 150° C. Comparing the slopes of the curves in graphs 54 and 65, the on-resistance of the SiC MOSFET 60 is lower than the on-resistance of the other SiC MOSFET device at nominal operating currents. For example, the curve 57 in graph 54 indicates drain current of 30 A at approximately 3 V, while the curve 58 in graph 56 shows drain current of 30 A at approximately 5V. Thus, the presently disclosed device design enables similar on-resistance as the other SiC MOSFET device at 25° C., as indicated by FIGS. 5 and 6, and further enables lower on-resistance than the other SiC MOSFET device at 150° C., as indicated by FIGS. 7 and 8, all while providing superior short-circuit performance, as indicated by FIG. 4.

For FIGS. 9-12, the drain-source voltage is represented on the x-axis in units of volts and the drain current density (saturation current density) is represented on the y-axis in units of amps per centimeter square ($A/cm^{-2}$). As previously discussed, the onset of saturation or saturation current density may refer to conductance being one fifth of the value at nominal current densities (e.g., approximately 200 $A/cm^{-2}$). Starting with FIG. 9, a graph 70 illustrates output current and voltage characteristics of a 1.2 kV SiC MOSFET device at 25° C. where pinch region 43 doping is varied between designs. For example, in certain embodiments, sheet doping density for the pinch region 43 may be varied between approximately $2.5 \times 10^{12}$ $cm^{-2}$ and approximately $2.5 \times 10^{14}$ $cm^{-2}$. In general, the graph 70 illustrates that the design with the lightest doped pinch region 43 (e.g., $2 \times 10^{12}$ $cm^{-2}$) demonstrates the lowest saturation current density, smallest output conductance per unit area, and a substantially constant current versus drain voltage dependence in curve 72. For example, curve 82, which represents the design with a conventional level of doping in the source region 20 (e.g., sheet doping density of about $2.5 \times 10^{14}$ $cm^{-2}$), includes a saturation current density of approximately greater than 2700 $A/cm^{-2}$, curve 74, which represents a design with a lower level of doping than curve 82 (e.g., sheet doping density of about $5 \times 10^{12}$ $cm^{-2}$), includes a saturation current density of approximately 1850 $A/cm^{-2}$, and curve 72, which represents the design with the lightest doped pinch region 43 (e.g., sheet doping density of about $2.5 \times 10^{12}$ $cm^{-2}$), demonstrates a saturation current density of approximately 600 $A/cm^{-2}$. Thus, using the lightest doped pinch region 43 enables reducing the saturation current density to 600 $A/cm^{-2}$, which is an approximately 60 to 70 percent reduction from the next lowest saturation current density of approximately 1850 $A/cm^{-2}$ demonstrated by the design with the higher level of doping in the pinch region 43, and an approximately 70 to 80 percent reduction from the saturation current density of approximately 2700 $A/cm^{-2}$ demonstrated by the design with the standard level of doping in the source region 20.

Further, as illustrated in the graph 70, the design with the lightly doped pinch region 43 (curve 72) employs the feedback mechanism described above, which may result in the nearly constant saturation current density and linear drain voltage dependence. That is, the saturation current density of curve 72 may remain substantially the same as drain-source voltage increases. In contrast, the saturation current density of the design with the conventional level of doping in the source region 20 does not show voltage hard saturation condition or high output conductance because the saturation current density continues to rise as the drain-source voltage rises. That is, the curve 82 has an increasing current continuing to rise after the onset of current saturation, whereas curve 72 shows a substantially more constant current density after reaching the onset of current saturation.

The lower saturation current density of the design with the lightly doped pinch region 43 results from the free carrier region being "pinched off," as discussed above. In some embodiments, peak current may be saturated at 5 to 10 times nominal current density ($J_{DS,nominal}$), whereas peak current of the other designs, such as the design with the standard level of doping (e.g., $1 \times 10^{19}$ $cm^{-3}$), may reach peak current from 7.5 to 20 times nominal current density. Accordingly, the design with the lightly doped pinch region 43 may improve short-circuit fault condition performance because the saturation current density is substantially lower than the other designs (e.g., curves 74, 76, 78, 80, and 82).

Figure 9:
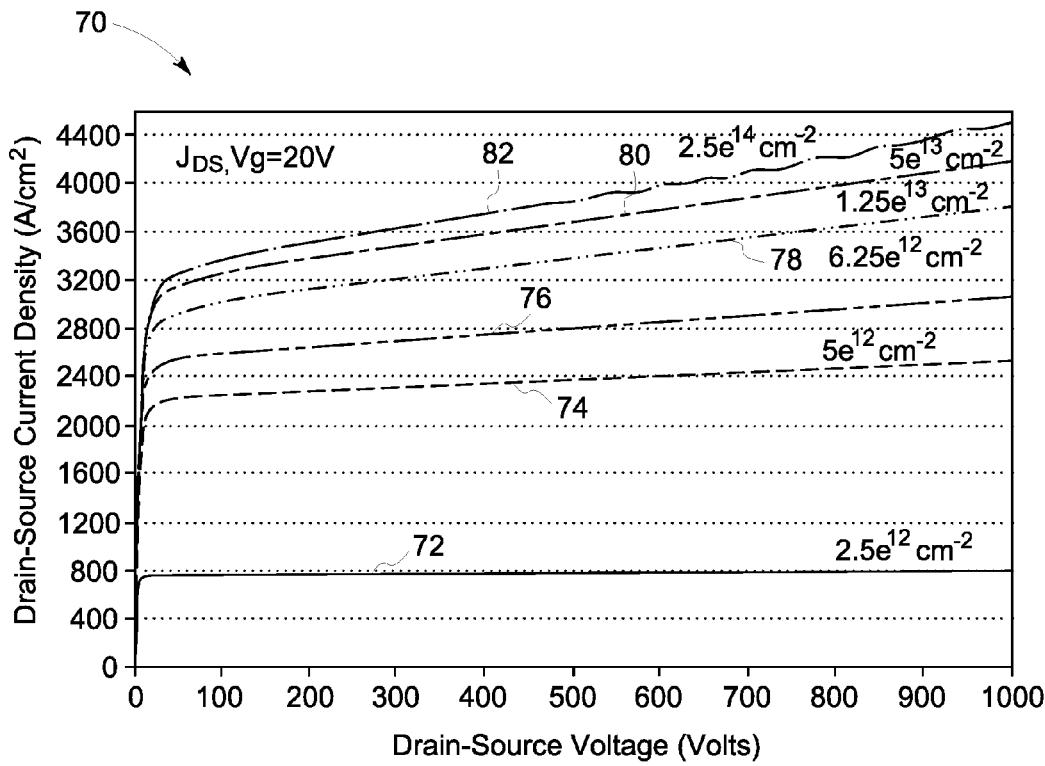
FIG. 9 is a graph illustrating output current and voltage characteristics of a 1.2 kV SiC MOSFET device at 25° C., wherein the pinch region doping is varied between designs, in accordance with embodiments of the present technique.
Figure 10:
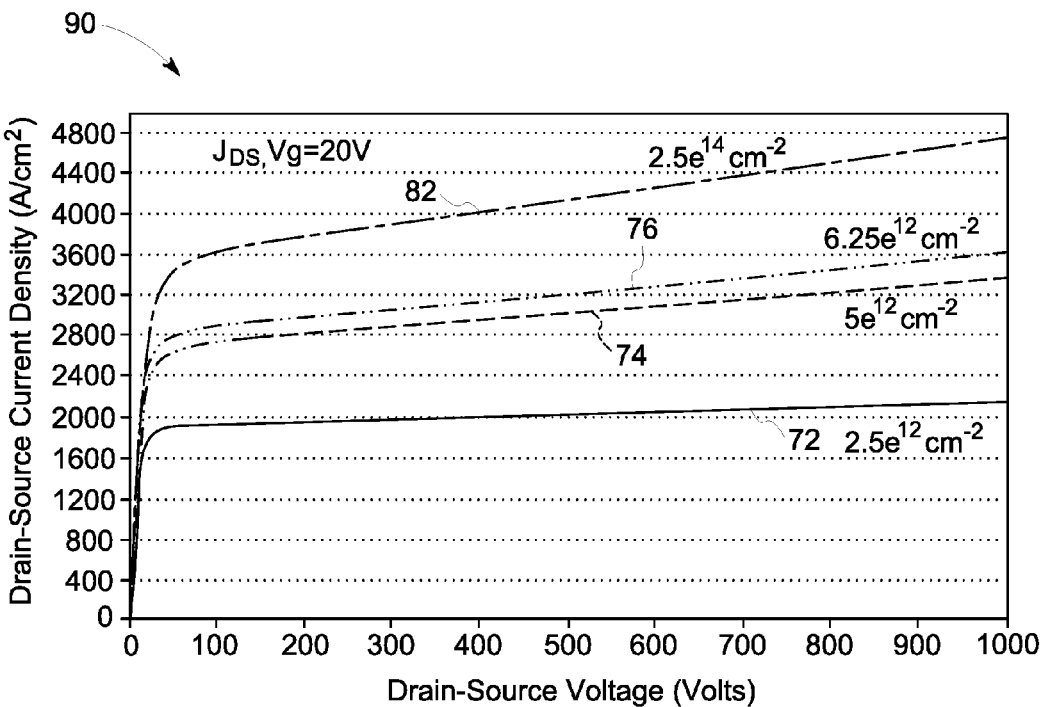
FIG. 10 is a graph illustrating output current and voltage characteristics of a 1.2 kV SiC MOSFET device at 150° C., wherein the pinch region doping is varied between designs, in accordance with embodiments of the present technique.

FIG. 10 is a graph 90 that illustrates additional output current and voltage characteristics of a 1.2 kilovolt SiC MOSFET device at 150° C., where pinch region doping is varied between designs. Graph 90 illustrates results for a subset of the embodiments depicted in FIG. 9, except that FIG. 10 shows the characteristics of these embodiments operating at a temperature 125° C. higher than in FIG. 9. As depicted in graph 90, the design that includes the lightly doped pinch region 43 (e.g., sheet doping density of about $2.5 \times 10^{12}$ $cm^{-2}$) produces the lowest saturation current density of approximately 1850 $A/cm^{-2}$, and the design with the standard level of doping (e.g., sheet doping density of about $2.5 \times 10^{14}$ $cm^{-2}$) produces the highest saturation current density of approximately 3500 $A/cm^{-2}$. Thus, the saturation current densities increase when the temperature of the SiC MOSFET device 10 increases under fault conditions, as shown in graph 90.

Figure 11:
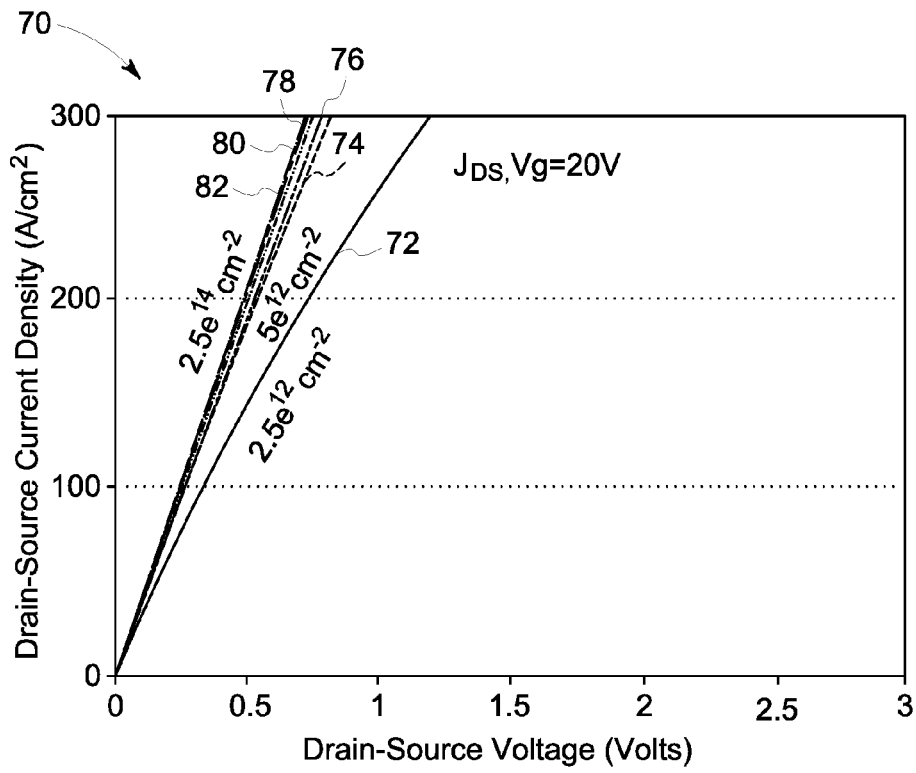
FIG. 11 is an enlarged portion of the graph of FIG. 9, in accordance with embodiments of the present technique.

FIG. 11 is an enlarged portion of the graph 70 of FIG. 9. The enlarged portion of the graph 70 generally shows that the design with the lightest doped pinch region 43 does not demonstrate a substantial increase in on-state resistance ($R_{ds}(on)$) at nominal current densities. As depicted, the design with the lightly doped pinch region 43, as represented by curve 72, has a substantially similar slope as the designs with increasing levels of doping, represented by the curves 74, 76, 78, 80, and 82. For example, at a nominal current density of 200 A/cm$^{-2}$, the designs with different levels of doping show similar voltage drops because the curves 72, 74, 76, 78, 80, and 82 are bunched together. Thus, conduction losses that result from using a lightly doped pinch region 43 to reduce the saturation current density may be negligible in some embodiments. In other words, the on-state resistance of the device 60 may not substantially increase as a result of the lightly doped pinch region 43.

Figure 12:
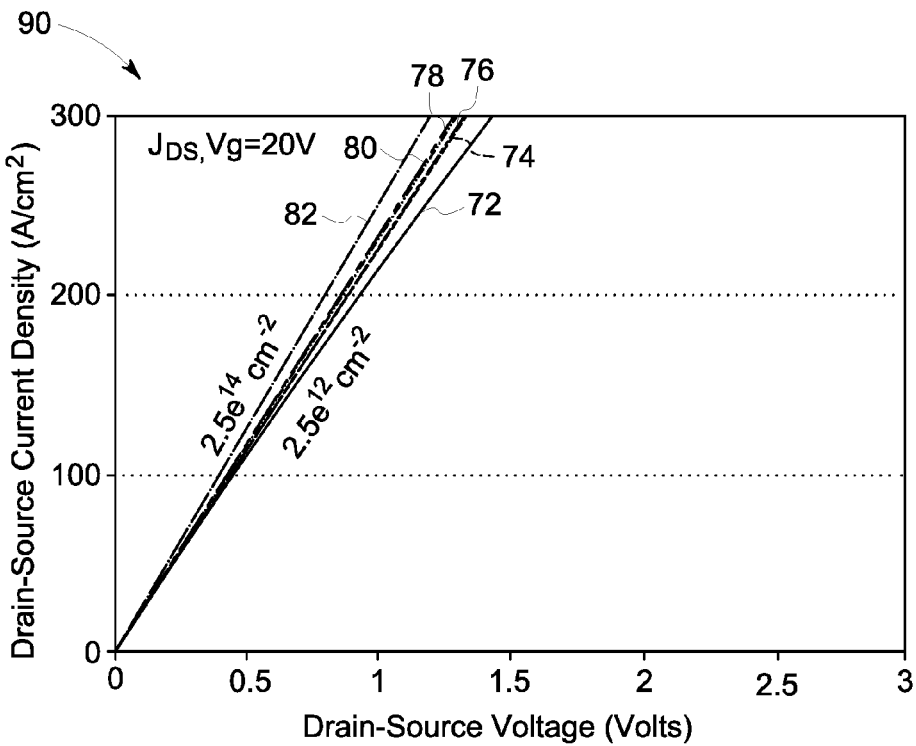
FIG. 12 is an enlarged portion of the graph of FIG. 10, in accordance with embodiments of the present technique.

FIG. 12 is an enlarged portion of the graph 90 of FIG. 10. Under higher temperature of 150° C., the increase in on-resistance between the design with the lightly doped pinch region 43 (e.g., sheet doping density of about 2.5×10$^{12}$ cm$^{-2}$) (curve 72) and the design with the standard level of doping (e.g., sheet doping density of about 2.5×10$^{14}$ cm$^{-2}$) (curve 82) is not significantly large (less than 20 percent) during nominal current of 200 A/cm$^{-2}$.

Figure 13:
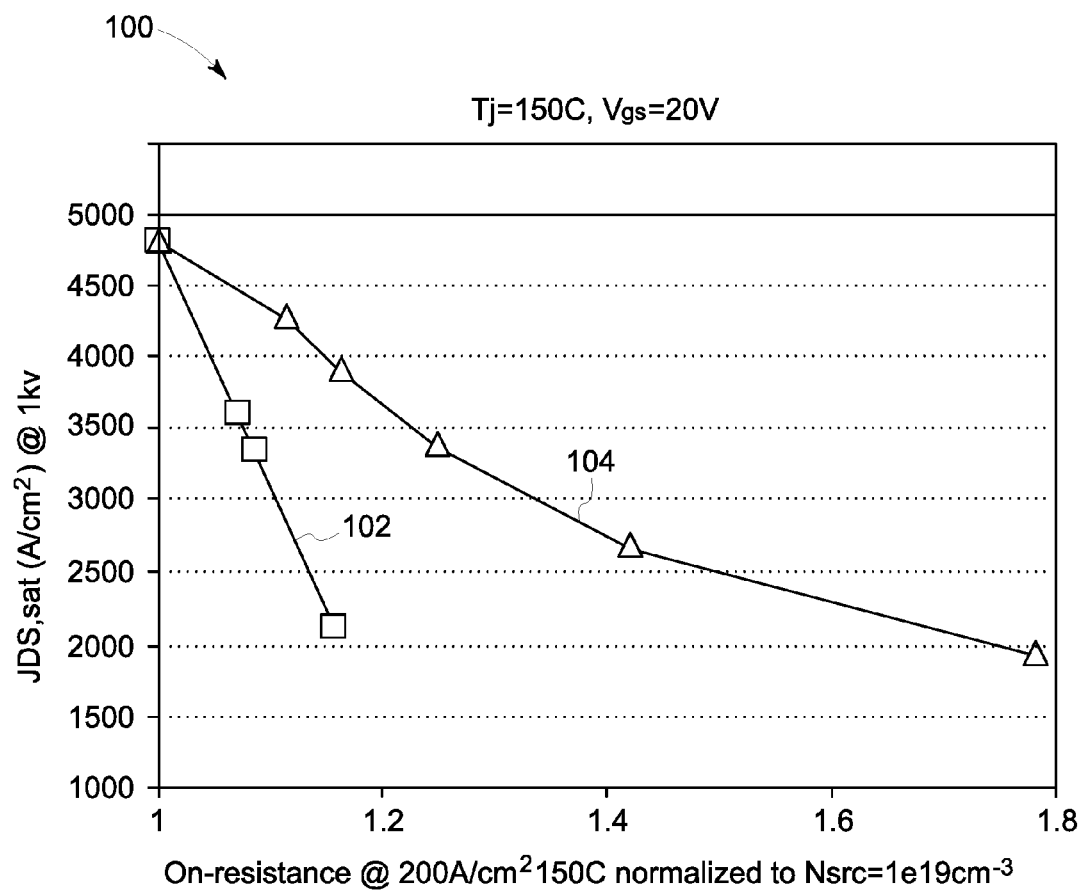
FIG. 13 is a graph illustrating tradeoffs between reducing saturation current density and increasing on-resistance using the embodiments disclosed herein versus other methods of reducing saturation current density.

FIG. 13 is a graph 100 illustrating tradeoffs between reducing saturation current and increasing on-resistance using the embodiments disclosed herein versus other methods. The graph 100 illustrates saturation current density ($J_{D,sat}$) in A/cm$^{-2}$ for 1200V rated SiC MOSFET at VDS=1 kV versus normalized on-resistance for embodiments of the present approach, as represented by the curve 102, and for other methods of adding source series resistance, as represented by the curve 104. More specifically, the on-resistances are normalized to the on-resistance of a MOSFET device having a sheet doping density of 2.5×10$^{14}$ cm$^{-2}$ throughout the source region 20, operating at a current density of 200 A/cm$^{-2}$ at 150° C. Curve 102 represents an embodiment of SiC device 60 illustrated in FIG. 3, while the curve 104 represents SiC MOSFET devices that use other methods of adding source series resistance, connecting a series resistor externally to the SiC MOSFET device, or the like. As depicted, the curve 102 indicates a greater reduction in the saturation current density is achieved with a significantly smaller increase in on-resistance, when compared to devices represented by the curve 104. That is, reducing the doping of the pinch region 43 lowers the saturation current density from approximately 4750 A/cm$^{-2}$ at an on-resistance of approximately 1 to approximately 2250 A/cm$^{-2}$ at an on-resistance of approximately 1.18 in curve 102. In contrast, using methods other than the disclosed pinch region 43, curve 104 shows that the same decrease in saturation current density results in an increase in on-resistance from 1 to approximately 1.8, which is an approximately 50 to 55 percent increase in on-resistance relative to the on-resistance enabled by the disclosed pinch region 43 designs.

Further, as illustrated in FIG. 13, the disclosed pinch region designs reduce the saturation current density from approximately 4750 A/cm$^{-2}$ to approximately 2250 A/cm$^{-2}$ (e.g., approximately 50 percent to 60 percent reduction in saturation current density), while increasing on-resistance from 1 to approximately 1.18 in curve 102, (e.g., approximately 5 percent to 50 percent increase in on-resistance). In contrast, curve 104 shows that the same decrease in saturation current density results in an approximately 80 percent increase in on-resistance (e.g., from 1 to 1.8) using methods other than the disclosed pinch region 43.

As previously discussed, the feedback mechanism may enable non-linear source series resistance because the high current causes depletion of the pinch region 43. Depletion of the pinch region 43 increases resistance, which causes a forward drop in voltage to increase, which further depletes the pinch region 43 and increases resistance. Accordingly, non-linearity of the source series resistance provided by reducing the doping level of the pinch region 43 may enable reduced saturation current density while minimally increasing on-resistance under nominal operation.

The inventors have provided an improved SiC device and method of fabricating thereof. Indeed, technical effects of the disclosure include using a lightly doped pinch region to improve the saturation characteristics of semiconductor devices for power conversion applications (e.g., SiC MOSFET devices). In particular, the disclosed devices have a source region that includes a lightly doped pinch region that exhibits higher resistance under higher current density (e.g., high drain source bias) than that of nominal use conditions (e.g., 4× to 10× $J_{D,nominal}$), which enhances the short-circuit fault condition ruggedness of the device without substantially increasing on-resistance during normal operation.

Ranges disclosed herein are inclusive and combinable (e.g., ranges of "approximately 2.5×10$^{12}$ cm$^{-2}$ and approximately 2.5×10$^{14}$ cm$^{-2}$", is inclusive of the endpoints and all intermediate values of the ranges of "approximately 2.5×10$^{12}$ cm$^{-2}$ and approximately 2.5×10$^{14}$ cm$^{-2}$" etc.). "Combination" is inclusive of blends, mixtures, alloys, reaction products, and the like. Furthermore, the terms "first," "second," and the like, herein do not denote any order, quantity, or importance, but rather are used to distinguish one element from another, and the terms "a" and "an" herein do not denote a limitation of quantity, but rather denote the presence of at least one of the referenced item. The modifier "approximately" or "about" used in connection with a quantity is inclusive of the state value and has the meaning dictated by context, (e.g., includes the degree of error associated with measurement of the particular quantity) and may be used interchangeably. The suffix "(s)" as used herein is intended to include both the singular and the plural of the term that it modifies, thereby including one or more of that term (e.g., the colorant(s) includes one or more colorants). Reference throughout the specification to "one embodiment", "some embodiments", "another embodiment", "an embodiment", and so forth, means that a particular element (e.g., feature, structure, and/or characteristic) described in connection with the embodiment is included in at least one embodiment described herein, and may or may not be present in other embodiments. In addition, it is to be understood that the described elements may be combined in any suitable manner in the various embodiments.

This written description uses examples to disclose the techniques, including the best mode, and also to enable any person skilled in the art to practice the techniques, including making and using any devices or systems and performing any incorporated methods. The patentable scope of the present disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:
1. A silicon carbide (SiC) device, comprising:
a gate electrode disposed above a SiC semiconductor layer, wherein the SiC semiconductor layer comprises:
a drift region having a first conductivity type;

a well region disposed adjacent to the drift region, wherein the well region has a second conductivity type; and a source region having the first conductivity type disposed adjacent to the well region, wherein the source region comprises a source contact region and a pinch region, wherein the pinch region is disposed only partially below the gate electrode, wherein a sheet doping density in the pinch region is less than $2.5\times10^{14}$ cm$^{-2}$, and wherein the pinch region depletes at a current density greater than a nominal current density of the SiC device to increase the resistance of the source region, wherein the nominal current density is a rated current density of the SiC device, and wherein the well region is doped about two times (2×) to about fifteen times (15×) greater than the pinch region.

2. The SiC device of claim 1, wherein the source contact region is at least about four times (4×) more heavily doped than the pinch region.

3. The SiC device of claim 1, wherein the pinch region substantially increases the resistance of the SiC device when the current density is at least about four times (4×) greater than the nominal current density of the SiC device.

4. The SiC device of claim 1, wherein the sheet doping density in the pinch region is between approximately $2.5\times10^{12}$ cm' and approximately $5\times10^{13}$ cm$^{-2}$.

5. The SiC device of claim 1, the width of the pinch region is between approximately 0.5 micrometers and approximately 2.5 micrometers, and wherein the pinch region provides a short-circuit withstand time between approximately 5 microseconds and 20 microseconds when supporting greater than 30 percent of rated drain-source voltage.

6. The SiC device of claim 1, wherein the peak current is limited to about four times (4×) to about ten times (10×) of a rated current of the SiC device under short-circuit faults with drain voltages of greater than 30 percent of a rated voltage of the SiC device.

7. The SiC device of claim 1, wherein the nominal current density is approximately 200 A/cm$^2$.

8. The SiC device of claim 1, wherein the device has a vertical device structure comprising a source/body contact disposed above the SiC semiconductor layer and a drain contact disposed below the SiC semiconductor layer.

9. The SiC device of claim 1, wherein a portion of the well region disposed adjacent the surface of the SiC semiconductor layer and below the gate electrode forms a channel region having the second conductivity-type.

10. A silicon carbide (SiC) device, comprising:
a plurality of semiconductor device cells, wherein each of the plurality of semiconductor device cells comprises:
a drift region having a first conductivity type;
a gate electrode disposed above the drift region;
a well region disposed adjacent to the drift region, wherein the well region has a second conductivity type; and
a source region having the first conductivity type disposed adjacent to the well region, wherein the source region comprises a source contact region and a pinch region, wherein the pinch region is not completely disposed below the gate electrode, wherein a sheet doping density in the pinch region is substantially less than $2.5\times10^{14}$ cm$^{-2}$ and a sheet doping density in the source contact region is at least $2.5\times10^{14}$ cm$^{-2}$, and wherein the well region is doped about two times (2×) to about fifteen times (15×) greater than the pinch region.

11. The SiC device of claim 10, wherein the pinch region depletes at a current density greater than a nominal current density of the SiC device to increase the resistance of the source region, wherein the nominal current density is a rated current density of the SiC device.

12. The SiC device of claim 10, wherein the semiconductor layer is included in a device comprising a MOSFET, UMOSFET, VMOSFETs, insulated gate bipolar transistors (IGBT), insulated base MOS-controlled thyristors (IB-MCT), junction field effect transistors (JFET), or metal-semiconductor field effect transistor (MESFET).

13. The SiC device of claim 10, wherein the pinch region substantially increases the resistance of the SiC device when a current density is at least about four times (4×) greater than a nominal current density of the SiC device, wherein the nominal current density is a rated current density of the SiC device.

14. The SiC device of claim 10, wherein the sheet doping density in the pinch region is between approximately $2.5\times10^{12}$ cm' and approximately $5\times10^{13}$ cm$^{-2}$ and the dopant concentration in the source contact region is between approximately $1\times10^{15}$ cm$^{-2}$ and approximately $8\times10^{15}$ cm$^{-2}$.

15. The SiC device of claim 10, wherein the width of the pinch region is between approximately 0.5 micrometers and approximately 2.5 micrometers.

16. The SiC device of claim 10, wherein the sheet doping density concentration of the pinch region times the length of the pinch region is from approximately $1.25\times10^{8}$ cm$^{-1}$ to $125\times10^{8}$ cm$^{-1}$.

17. The SiC device of claim 10, wherein the pinch region provides near constant drain current versus drain voltage dependence.

18. A method of fabricating a silicon carbide (SiC) semiconductor layer, comprising:
forming a source region having a first conductivity type, comprising:
implanting a pinch region of the source region to a sheet doping density of substantially less than $2.5\times10^{14}$ cm$^{-2}$; and
implanting a source contact region of the source region adjacent to the pinch region to a sheet doping density higher than that of the pinch region;
forming a well region having a second conductivity type adjacent to the source region by implanting the well region to a sheet doping density that is about two times (2×) to about fifteen times (15×) higher than that of the pinch region; and
forming a gate electrode above a portion of the pinch region and a portion of the well region, wherein the gate electrode does not completely cover the pinch region of the source region.

19. The method of claim 18, wherein implanting the source contact region comprises implanting the source contact region to a sheet doping density of at least about four times (4×) greater than the sheet doping density of the pinch region.

20. The method of claim 19, comprising implanting the pinch region to a sheet doping density between approximately $2.5\times10^{12}$ cm$^{-2}$ and approximately $5\times10^{13}$ cm$^{-2}$.

* * * * *